United States Patent
Herrmann

(10) Patent No.: US 10,651,356 B2
(45) Date of Patent: May 12, 2020

(54) LIGHT-EMITTING COMPONENT

(71) Applicant: OSRAM OLED GmbH, Regensburg (DE)

(72) Inventor: Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 221 days.

(21) Appl. No.: 15/663,984

(22) Filed: Jul. 31, 2017

(65) Prior Publication Data
US 2018/0040787 A1 Feb. 8, 2018

(30) Foreign Application Priority Data
Aug. 2, 2016 (DE) .......... 10 2016 114 277

(51) Int. Cl.
| | | |
|---|---|---|
| *H01L 33/60* | (2010.01) | |
| *H01L 25/075* | (2006.01) | |
| *H01L 33/62* | (2010.01) | |
| *H01L 33/38* | (2010.01) | |
| *F21Y 115/10* | (2016.01) | |

(52) U.S. Cl.
CPC .......... *H01L 33/60* (2013.01); *H01L 25/0753* (2013.01); *H01L 33/62* (2013.01); *F21Y 2115/10* (2016.08); *H01L 33/38* (2013.01); *H01L 2224/48091* (2013.01)

(58) Field of Classification Search
CPC ....... H01L 33/60; H01L 33/62; H01L 25/753; F21Y 2115/10
USPC .......................................................... 257/98
See application file for complete search history.

(56) References Cited

U.S. PATENT DOCUMENTS 8,071,990 B2  12/2011  Bogner et al.

FOREIGN PATENT DOCUMENTS

| DE | 197 57 850 A1 | 7/1998 | |
|---|---|---|---|
| DE | 10 2011 087 887 A1 | 6/2013 | |
| DE | 10 2016 111 790 | 12/2017 | |
| DE | 102016111790 A1 * | 12/2017 | ............. H01L 33/62 |
| JP | 2015-135918 A | 7/2015 | |
| WO | 2016/156329 A1 | 6/2016 | |

* cited by examiner

*Primary Examiner* — Raj R Gupta
(74) *Attorney, Agent, or Firm* — DLA Piper LLP (US)

(57) ABSTRACT

A light-emitting component includes at least two radiation-emitting semiconductor chips of a first type configured to emit electromagnetic radiation during operation, and a light exit surface at a light exit side of the light-emitting component, wherein each of the radiation-emitting semiconductor chips of the first type includes a semiconductor layer sequence with a stacking direction, the stacking direction of each radiation-emitting semiconductor chip of the first type is parallel to the light exit surface of the component, and all the semiconductor chips of the first type are arranged directly below the light exit surface.

9 Claims, 12 Drawing Sheets

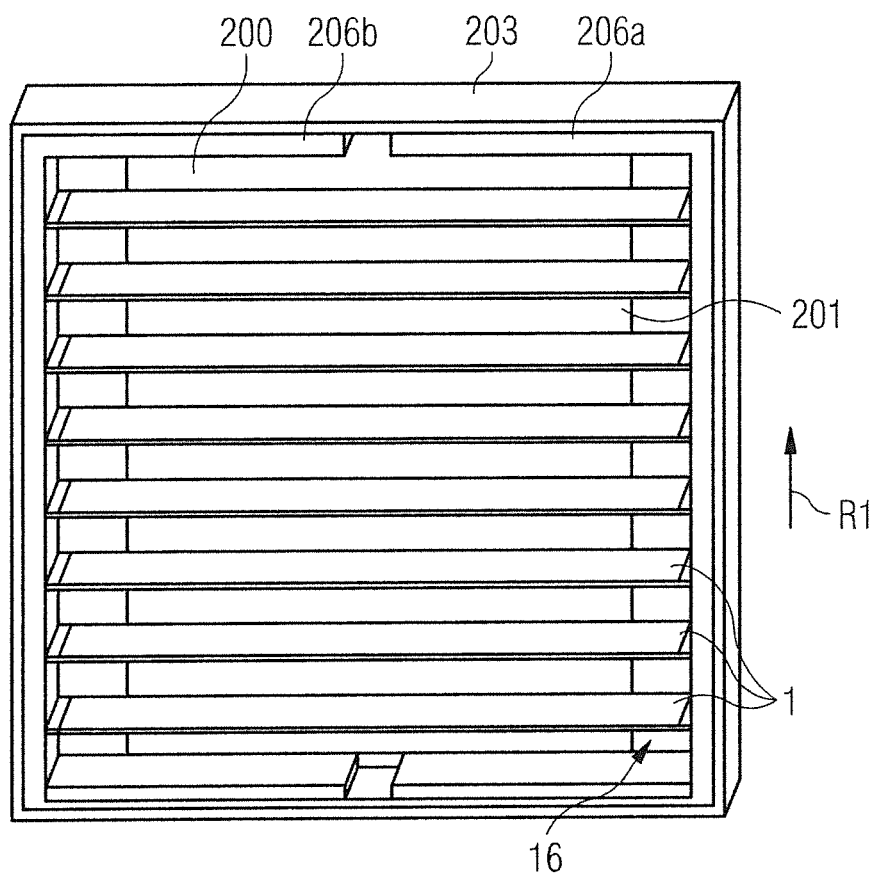

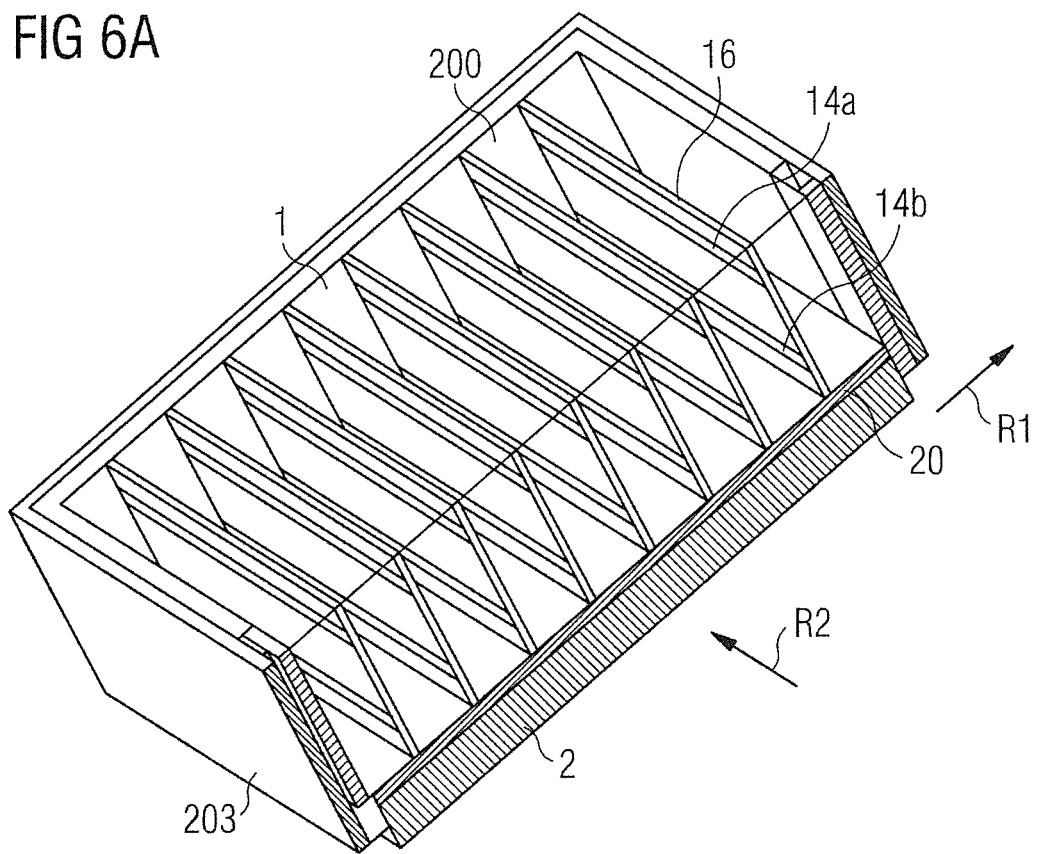

LIGHT-EMITTING COMPONENT

TECHNICAL FIELD

This disclosure relates to a light-emitting component.

BACKGROUND

U.S. Pat. No. 8,071,990 B2 describes a light-emitting component.

There is a need to provide a light-emitting component of a particularly compact design that also has a particularly high radiant power.

SUMMARY

I provide a light-emitting component including at least two radiation-emitting semiconductor chips of a first type configured to emit electromagnetic radiation during operation, and a light exit surface at a light exit side of the light-emitting component, wherein each of the radiation-emitting semiconductor chips of the first type includes a semiconductor layer sequence with a stacking direction, the stacking direction of each radiation-emitting semiconductor chip of the first type is parallel to the light exit surface of the component, and all the semiconductor chips of the first type are arranged directly below the light exit surface.

I also provide a light-emitting component including at least two radiation-emitting semiconductor chips of a first type configured to emit electromagnetic radiation during operation, at least one radiation-emitting semiconductor chip of a second type configured to emit electromagnetic radiation during operation, and a light exit surface at a light exit side of the light-emitting component, wherein each of the radiation-emitting semiconductor chips of the first type includes a semiconductor layer sequence with a stacking direction, each of the radiation-emitting semiconductor chips of the second type includes a second semiconductor layer sequence having a second stacking direction, the stacking direction of each radiation-emitting semiconductor chip of the first type is parallel to the light exit surface of the component, all the semiconductor chips of the first type are arranged directly below the light exit surface, the radiation-emitting semiconductor chips of the first type are arranged between the at least one radiation-emitting semiconductor chip of the second type and the light exit surface, and the second stacking direction is transverse or perpendicular to the light exit surface of the component, and the radiation-emitting semiconductor chip of the second type is partly covered by the radiation-emitting semiconductor chips of the first type on its side facing the light exit surface.

I further provide a light-emitting component including at least two radiation-emitting semiconductor chips of a first type configured to emit electromagnetic radiation during operation, at least one radiation-emitting semiconductor chip of a second type configured to emit electromagnetic radiation during operation, and a light exit surface at a light exit side of the light-emitting component, wherein each of the radiation-emitting semiconductor chips of the first type includes a semiconductor layer sequence with a first stacking direction, each of the radiation-emitting semiconductor chips of the second type includes a second semiconductor layer sequence having a second stacking direction, the stacking direction of each radiation-emitting semiconductor chip of the first type is parallel to the light exit surface of the component, all the semiconductor chips of the first type are arranged directly below the light exit surface, the radiation-emitting semiconductor chips of the first type are arranged between the at least one radiation-emitting semiconductor chip of the second type and the light exit surface, and the second stacking direction is parallel to the light exit surface of the component, and the radiation-emitting semiconductor chips of the second type and the radiation-emitting semiconductor chips of the first type do not cover one another.

BRIEF DESCRIPTION OF THE DRAWINGS

FIGS. 2A, 2B, 2C, 3A, 3B, 4, 5A, 5B, 6A, 6B, 6C, 6D, 6E, 7A, 7B, 8A, 8B, 9A, 9B, 10A, 10B, 11A, 11B are schematic views of examples of the light-emitting components.

Figure 1A:
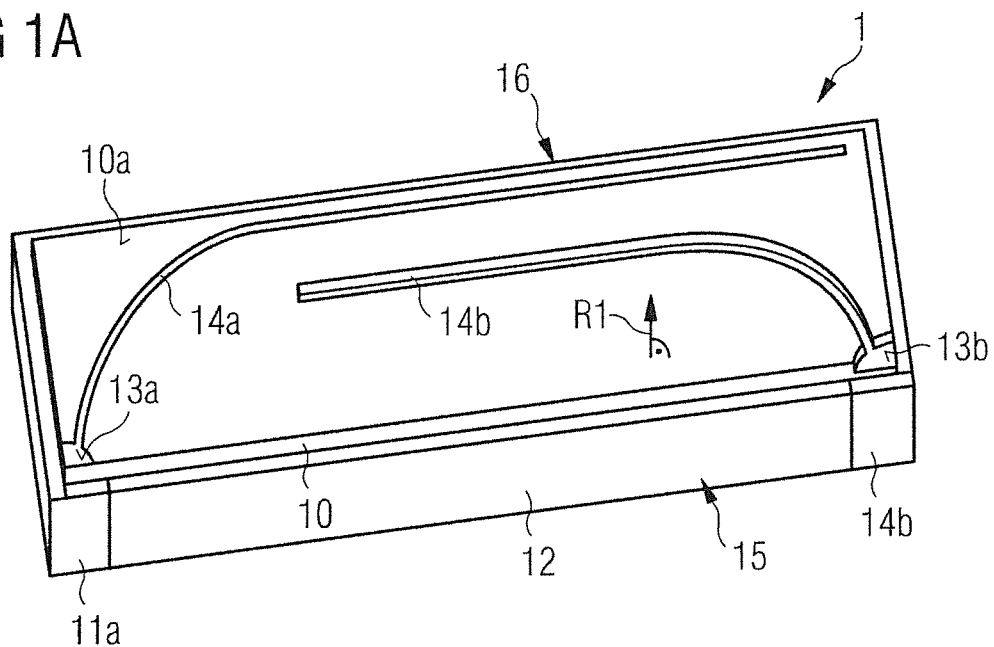
FIGS. 1A and 1B are schematic views of a radiation-emitting semiconductor chip that can be used as a radiation-emitting semiconductor chip of the first type.

LIST OF REFERENCE SIGNS 1 radiation-emitting semiconductor chips of the first type
10 semiconductor layer sequence
10a top surface
11a, 11b contact pads
12 carrier
13a, 13b contact pads
14a, 14b current distribution paths
15 second side surface
16 first side surface
2 radiation-emitting semiconductor chips of the second type
20 semiconductor layer sequence
21a contact pads
200 light exit surface
200a light exit side
201 connection carrier
202, 202a, 202b encapsulation material
203, 203a, 203b housing body
204 insulation means
205 optical element
206a, 206b connecting elements
207a, 207b connecting pads
208 reflector element
R1, R2 stacking direction

DETAILED DESCRIPTION

During operation, my light-emitting component more specifically emits electromagnetic radiation of a wavelength range between UV radiation and infrared radiation, in particular visible light. More specifically, the light-emitting component may be a light-emitting diode comprising two or more light-emitting diode chips.

The light-emitting component may comprise at least two radiation-emitting semiconductor chips of a first type configured to emit electromagnetic radiation during operation. The radiation-emitting semiconductor chips of the first type are, for example, light-emitting diode chips that emit electromagnetic radiation in the wavelength range between infrared radiation and UV radiation during operation. Within the scope of the manufacturing tolerance, the radiation-emitting semiconductor chips of the first type are capable of emitting electromagnetic radiation in the same wavelength range during operation. However, the radiation-emitting semiconductor chips of the first type may also be semiconductor chips that emit electromagnetic radiation in different wavelength ranges during operation. The radiation-emitting semiconductor chips of the first type are then capable of emitting light of different colors, for example. Except for the wavelength range of the electromagnetic radiation they emit, the radiation-emitting semiconductor chips of the first type are of a similar design, i.e. they have the same or similar forms and the same or similar geometrical dimensions.

A light exit surface may be provided at a light exit side of the light-emitting component. The light exit surface of the light-emitting component is defined as the side through which most or all of the light emitted by the light-emitting component exits the light-emitting component. In this case, most or all of the light passes through the light exit surface. More specifically, the light-emitting surface may be a virtual, i.e. an imaginary, surface which may extend parallel to a main extension plane of the light-emitting component and which is arranged downstream of all the radiation-emitting semiconductor chips of the light-emitting component on the light exit side of the light-emitting component. Furthermore, the light exit surface may be the outer surface of an optical element, for example, a translucent cover plate.

Each of the radiation-emitting semiconductor chips of the first type may have a semiconductor layer sequence with a stacking direction. The semiconductor layer sequence of a radiation-emitting semiconductor chip of the first type is, for example, applied on a carrier or on a growth substrate of the semiconductor chip. The stacking direction may be perpendicular to a main extension plane of the carrier or the growth substrate, for example. More specifically, the stacking direction may be parallel to a direction of growth of the semiconductor layer sequence.

The stacking direction of each radiation-emitting semiconductor chip of the first type may be parallel to the light exit surface of the component.

"Parallel" means parallel within the scope of the manufacturing tolerance. This means that minor deviations of +/−4° at the most, in particular of +/−2° at the most, from a mathematically precise parallel alignment shall also be covered by the definition of a parallel alignment.

The radiation-emitting semiconductor chips of the first type are in particular characterized in that a main extension plane of the semiconductor layer sequence of each radiation-emitting semiconductor chip is perpendicular to the light exit surface.

"Perpendicular" means within the scope of the manufacturing tolerance, meaning that deviations of +/−4° at the most, in particular deviations of +/−2° at the most, from a mathematically precise perpendicular alignment shall also be covered by the definition of a perpendicular alignment.

All the semiconductor chips of the first type may be arranged directly below the light exit surface. This means that at least part of the electromagnetic radiation emitted by the radiation-emitting semiconductor chips can reach the light exit surface directly and is not guided to the light exit surface of the light-emitting component by an optical guide, for example. More specifically, the semiconductor chips of the first type are not covered by a housing body or any other opaque element of the light-emitting component.

Furthermore, the light exit surface may be assigned a contour, for example, that surrounds the light exit surface on all sides in the lateral directions, the directions parallel to the light exit surface. In a plan view of the component, at least a majority of the radiation-emitting semiconductor chips are then arranged within the contour. At least a majority means that at least 80%, in particular at least 90%, in particular 100%, of an outer surface, that faces the light exit surface, of each of the semiconductor chips is arranged within the contour. In a plan view, for example, means that the contour is vertically projected onto a plane in which the outer surfaces of the semiconductor chips are arranged.

In other words, at least part of the electromagnetic radiation emitted by each radiation-emitting semiconductor chip of the component during operation can reach the light exit surface directly, i.e. without being reflected. The semiconductor chips are not covered by a part of the component housing, for example, but can be seen through the light exit surface when viewed from the top.

The light-emitting component may relate to a component comprising
at least two radiation-emitting semiconductor chips of a first type configured to emit electromagnetic radiation during operation, and
a light exit surface at a light exit side of the light-emitting component, wherein
each of the radiation-emitting semiconductor chips of the first type comprises a semiconductor layer sequence with a stacking direction,
the stacking direction of each radiation-emitting semiconductor chip of the first type is parallel to the light exit surface of the component, and
all the semiconductor chips of the first type are arranged directly below the light exit surface.

A light-emitting component as set forth herein is based on the following considerations, amongst others: In conventional light-emitting components such as conventional light-emitting diodes, a light-emitting diode chip is mounted in a housing, for example, such that the stacking direction of its semiconductor layer sequence will be perpendicular to a light exit surface. Consequently, only a relatively small number of light-emitting diode chips can be accommodated in a component—without changing the surface area of the light-emitting component—since the light-emitting diode chips occupy a lot of the surface area. The light-emitting component herein is based on the finding that, if the semiconductor chips are arranged with their stacking direction parallel to the light exit surface, a multitude of semiconductor chips can thus be arranged "in a row" on a predetermined surface area. This allows a much higher number of semiconductor chips to be arranged on one and the same surface area than if the semiconductor chips are mounted with their stacking direction perpendicular to the light exit surface. A large number of light-emitting semiconductor chips can therefore be integrated in a light-emitting component while maintaining a compact design, thus resulting in a high radiant power of the component. The radiation-emitting semiconductor chips are arranged in a lamellar-like fashion. This makes it possible to contact and control the radiation-emitting semiconductor chips individually or to connect them in series and/or in parallel with each other in the light-emitting component.

"In a row" means that the semiconductor chips are, for example, arranged along an imaginary line in the same orientation, which imaginary line extends through the geometrical center of gravity of each semiconductor chip. The imaginary line can be an imaginary straight line. The semiconductor chips can be arranged along the line with or without spacing between them. This means that adjacent semiconductor chips can also directly adjoin each other.

The stacking directions of the semiconductor chips of the first type may be parallel relative to each other. This means that, in this case, all the semiconductor chips of the first type are mounted in the same orientation relative to the radiation exit surface and arranged one after the other in a row. This arrangement facilitates the contacting of the semiconductor chips and results in a particular compact design of the light-emitting component.

Each radiation-emitting semiconductor chip of the first type may have a first side surface parallel to the light exit surface, and a main extension plane of the semiconductor layer sequence perpendicular to the light exit surface. This means that, in contrast to conventional light-emitting components, it is not a main surface of the radiation-emitting semiconductor chip parallel to the light exit surface of the component, but a side surface of the radiation-emitting semiconductor chip. The surface area of the side surface is substantially smaller than the surface area of a main surface, for example, the top surface of the semiconductor chip. The surface area of the side surface, for example, is 20% at the most, in particular 10% at the most, of the surface area of a main surface of the semiconductor chip. This allows a much higher number of semiconductor chips of the first type to be accommodated in the same surface area than would be possible in the case of conventionally oriented semiconductor chips.

Contact pads of each radiation-emitting semiconductor chip of the first type may be freely accessible on the side of the component facing away from the light exit side. In other words, the radiation-emitting semiconductor chips of the first type can be directly contacted at an underside of the light-emitting component facing away from the light exit side. More specifically, the contact pads of the radiation-emitting semiconductor chips can be in direct contact with a semiconductor material of the semiconductor chip or a metallization of the semiconductor chip. For example, the contact pads can also be structures reinforced by electroplating which were built directly on the semiconductor chip. This means that the contact pads can be monolithically connected to the semiconductor chip. Furthermore, the contact pads may be connection pads, for example, metallic elements such as pins attached to the semiconductor chip of the first type by a connecting material such as a soldering material. At any rate, in this example, there is no connection carrier such as a circuit board, a printed circuit board, a metal core circuit board or a lead frame disposed between an intended destination of the light-emitting component and the radiation-emitting semiconductor chip, but the semiconductor chips can be mounted directly at their intended destination.

The light-emitting component may comprise at least one radiation-emitting semiconductor chip of a second type, with the radiation-emitting semiconductor chips of the first type being arranged between the at least one radiation-emitting semiconductor chip of the second type and the light exit surface. This means that the light-emitting component comprises at least one additional radiation-emitting semiconductor chip arranged in a layer or a plane of the component below the plane of the radiation-emitting semiconductor chip of the first type, with "below" to be understood as relative to the light exit surface. This allows the number of radiation-emitting semiconductor chips in the light-emitting component to be further increased without having to increase the surface area. This means that the component can be of a particularly compact design and at the same time have a particularly high luminance.

The at least one radiation-emitting semiconductor chip of the second type may have a semiconductor layer sequence with a stacking direction, which stacking direction is transverse or perpendicular to the light exit surface of the component and the radiation-emitting semiconductor chip of the second type, on its side facing the light exit surface, is partially covered by the radiation-emitting semiconductor chips of the first type. In other words, in this case the at least one radiation-emitting semiconductor chip of the second type is a conventionally oriented semiconductor chip having one main surface thereof, in particular its top surface, facing the light exit surface of the light-emitting component. The semiconductor chips of the first type are arranged between the semiconductor chips of the second type and the light exit surface and cover the radiation exit surface of the at least one radiation-emitting semiconductor chip of the second type.

For example, at least 50% of the main surface of the radiation-emitting semiconductor chip of the second type facing the light exit surface is covered by the radiation-emitting semiconductor chips of the first type. The radiation-emitting semiconductor chips of the first type are designed to be at least partially transparent or permeable to the electromagnetic radiation emitted by the radiation-emitting semiconductor chip of the second type during operation. During operation of the light-emitting component, this then allows the semiconductor chips of the first and second types to be operated simultaneously or separately from each other. This enables the light-emitting component to emit mixed radiation, in particular of a white color, and/or light of different colors. In this example, it is furthermore possible in particular for the light-emitting component to comprise precisely one radiation-emitting semiconductor chip of the second type arranged to cover most of the area of the component, for example. The surface area of a main surface of the semiconductor chip of the second type, which main surface faces the light exit surface, e.g. the radiation exit surface of the semiconductor chip of the second type, comprises at least 50%, more particularly at least 75%, of the area of the component, for example. It is possible to then mount two or more semiconductor chips of the first type above the radiation-emitting semiconductor chip of the second type such that the semiconductor chip of the second type will be covered by the semiconductor chips of the first type.

The radiation-emitting semiconductor chip of the second type may have a semiconductor layer sequence with a stacking direction, which stacking direction is parallel to the light exit surface of the component. This means that the at least one radiation-emitting semiconductor chip of the second type will then be a semiconductor chip which is likewise—i.e. like the semiconductor chips of the first type—arranged transversally. This, for example, allows the same number of radiation-emitting semiconductor chips of the second type to be provided in the component as the number of radiation-emitting semiconductor chips of the first type, with the radiation-emitting semiconductor chips of the first and second types being arranged in different planes of the component. This results in a particularly compact component having a particularly high number of optoelectronic semiconductor chips. Such a component thus has a particularly high radiant power. It is possible to also mount light-emitting semiconductor chips in further planes of the component, which light-emitting semiconductor chips each have semiconductor layer sequences whose stacking directions are aligned perpendicular or parallel to the light exit surface.

Each radiation-emitting semiconductor chip of the second type may have its side facing the light exit surface covered by a radiation-emitting semiconductor chip of the first type. In this case, the radiation-emitting semiconductor chips of the first and second types can thus be arranged directly on top of one another, resulting in each radiation-emitting semiconductor chip of the first type being transilluminated by the radiation of a semiconductor chip of the second type which is arranged underneath it. This ensures a particularly high luminance.

The radiation-emitting semiconductor chips of the second type and the radiation-emitting semiconductor chips of the first type may not cover each other. In this case, the radiation-emitting semiconductor chips of the first and second types are alternately arranged in a lateral direction, thus allowing the electromagnetic radiation of each semiconductor chip to reach the light exit surface of the component without transilluminating the other type of semiconductor chip. This means that the semiconductor chips are alternately arranged in different planes of the component, for example.

In this example, fewer semiconductor chips are present in the component than in an example in which each radiation-emitting semiconductor chip of the second type has its side facing the light exit surface covered by a radiation-emitting semiconductor chip of the first type. However, the variant in which the different types of semiconductor chips do not cover each other allows semiconductor chips of the first type to be arranged laterally spaced from each other, which facilitates the heat dissipation of the component during operation.

The light-emitting components set forth herein feature the following advantages, amongst others:

The components are of a compact design and still achieve a high light output because the radiation-emitting semiconductor chips of the first type take up significantly less space in the component due to their specific orientation than conventionally mounted semiconductor chips.

Furthermore, if the semiconductor chips of the component are controlled separately, semiconductor chips located in different areas of the component can be operated which allows light to be emitted in different spatial directions or the light-emitting component to be used as a simple display device.

When radiation-emitting semiconductor chips of the second type are present whose stacking direction is perpendicular to the light exit surface of the component, different chip technologies can be combined with one another. This makes it possible to use the light-emitting component in a particularly versatile manner.

Furthermore, it is possible to accommodate the semiconductor chips of the component in a cavity, for example, the cavity of a housing, which cavity may serve as a mixing chamber for the light emitted by the light-emitting semiconductor chips during operation. The cavity may comprise separated areas to allow emission of light into different spatial areas or the use of the light-emitting component as a display device in a particularly simple manner.

Furthermore, conversion elements can be used in the light-emitting component which elements will convert at least part of the electromagnetic radiation emitted by the semiconductor chips during operation into electromagnetic radiation of preferably longer wavelengths. In this case, it is possible to use different application methods to apply and introduce the converter into different types of semiconductor chips. The semiconductor chips of the first type may be integrally molded with a conversion material, for example, whereas the semiconductor chips of the second type can be free of any converter material or be coated with a converter material. Other combinations are also possible.

The light-emitting component can furthermore simply be attached to its intended point of destination. For this purpose, the light-emitting component can be of a surface-mountable design, for example. Moreover, it is possible for the light-emitting component to have pins which can be used to mount the light-emitting component in a manner similar to an IC chip.

Due to its high light output, a light-emitting component as set forth herein is especially also suitable as a flashlight for use in a mobile device such as a mobile phone or a digital camera.

In the following, the light-emitting component is described in more detail with reference to examples and associated figures.

Throughout the figures, identical or similar elements or elements having the same effect are designated using the same reference signs. The figures and the relative proportions of the parts illustrated therein are not true to scale. In fact, the representation of individual elements may be exaggerated for a greater clarity and/or ease of reference.

FIG. 1A is a schematic perspective view of an optoelectronic semiconductor chip that may be used as an optoelectronic semiconductor chip of the first type 1 in a light-emitting component as set forth herein, for example. The semiconductor chip 1 comprises a semiconductor layer sequence 10. The semiconductor layer sequence 10 comprises an active region, for example, provided to generate electromagnetic radiation during operation of the semiconductor chip. The semiconductor layer sequence 10 has a stacking direction R1 perpendicular to a top surface 10a and a main extension plane of the semiconductor chip.

The semiconductor layer sequence 10 is deposited on a carrier 12. The carrier 12 can in particular be a growth substrate for the semiconductor layer sequence 10. The stacking direction R1 will then be parallel to a direction of growth of the semiconductor layer sequence, for example, which may be epitaxially deposited on the carrier 12.

The carrier 12 is preferably permeable to electromagnetic radiation generated in the semiconductor chip 1. The carrier 12 may be a growth substrate, for example, formed with or consisting of sapphire.

Figure 1B:
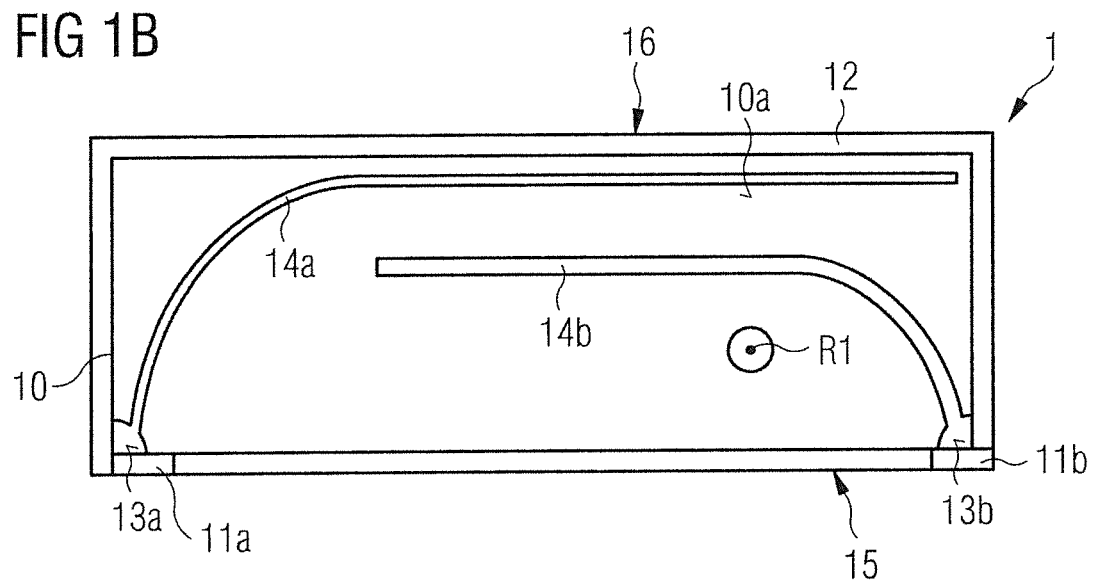

The optoelectronic semiconductor chip furthermore comprises contact pads 11a, 11b, that may take the form of metallizations, or metallizations reinforced by electroplating, or pins. The contact pads 11a, 11b are electroconductively connected to the contact surfaces 13a, 13b on the top surface 10a of the semiconductor chip 1. The contact pads 13a, 13b can connect to power distribution paths 14a, 14b extending on the top surface 10a. As shown in FIGS. 1A and 1B, the power distribution paths may have a curved course. However, it is also possible for the power distribution paths to extend along straight lines over the top surface 10a. The contact pads, the contact surfaces and the power distribution paths are used to supply the required operating current to the p- and n-sides of the semiconductor chip.

If the semiconductor chip is a semiconductor chip of the first type, the radiation-emitting semiconductor chip is to be mounted on a second side surface 15 opposite to a first side surface 16. This can also be seen from the schematic lateral view of FIG. 1B, for example. In other words, in this example, an optoelectronic semiconductor chip of the first type 1 is not mounted at its destination point in the component via its bottom surface facing away from the top surface 10a, but via a side surface thereof, the second side surface 15. In the light-emitting component, the first side surface 16 may then be arranged to be parallel to a light exit surface 200.

The radiation-emitting semiconductor chip of the first type 1 can be contacted on its second side surface 15 via the contact pads 11a, 11b, which contact pads 11a, 11b may also extend beyond the carrier 12, unlike the view of FIG. 1B.

A radiation-emitting semiconductor chip of the first type 1 is described in a different context in PCT/EP2016/056819, the subject matter of which is incorporated herein by reference.

First examples of a light-emitting component as set forth herein will be explained in more detail with reference to the schematic views of FIGS. 2A, 2B and 2C.

Figure 2A:
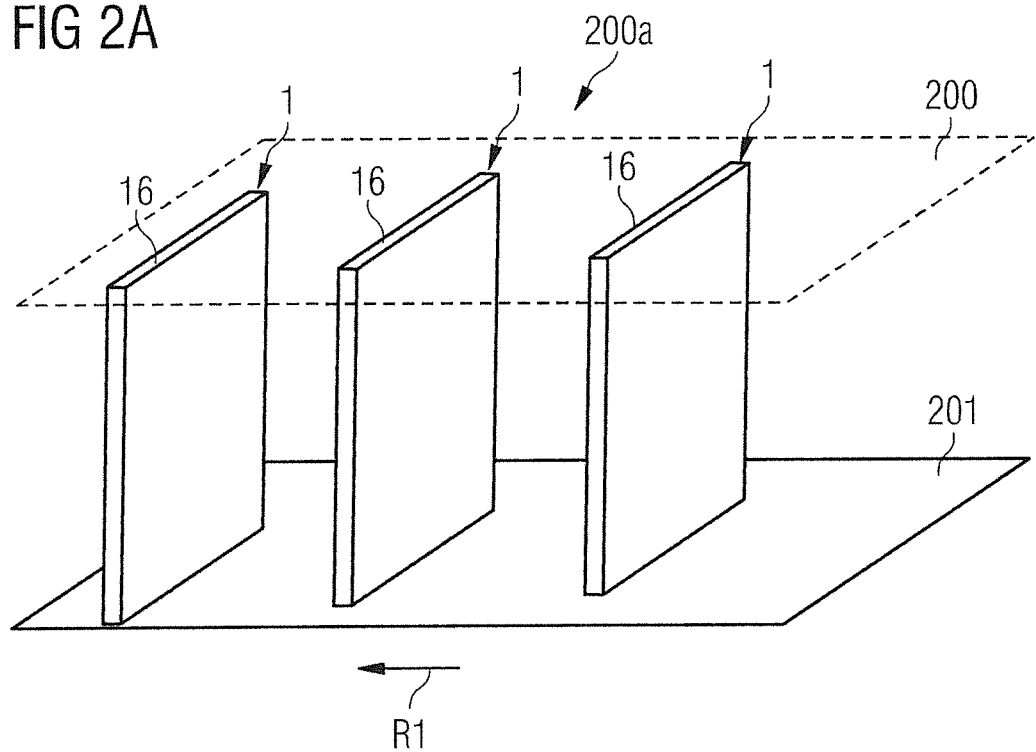

In the example of FIG. 2A, the radiation-emitting semiconductor chips of the first type 1 are mounted on a connection carrier 201 via their second side surface 15. The connection carrier 201 may be a circuit board, a printed circuit board, a metal core circuit board, a ceramic base body with contact pads and conductor tracks or a lead frame. Most of the light produced by the component will exit the component through the light exit surface 200 on the light exit side 200a thereof. The radiation-emitting semiconductor chips of the first type are arranged such that the stacking direction R1 for each of the semiconductor chips 1 is parallel to the light exit surface 200.

As indicated in FIG. 2A, the light exit surface 200 can be an imaginary virtual surface which is parallel to the main extension plane of the connection carrier 201, for example.

Figure 2B:
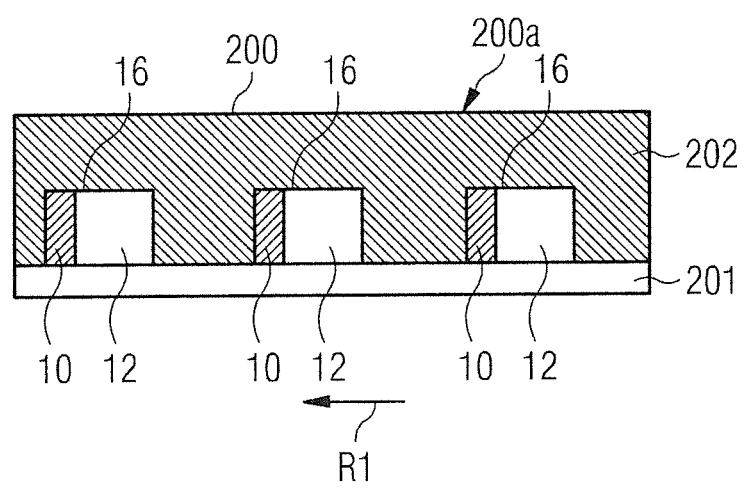

In the example of FIG. 2B, the radiation-emitting semiconductor chips of the first type 1 mounted on the connection carrier 201 are surrounded by an encapsulation material 202. The encapsulation material 202 may be a radiation-permeable material, for example, that can be formed with a plastic material such as silicone and/or epoxy resin. In addition, the encapsulation material 202 may comprise radiation-scattering and/or radiation-reflecting and/or radiation-converting constituents. The encapsulation material 202 may, for example, comprise particles of a luminescence conversion material.

If the radiation-emitting semiconductor chips 1 produce blue light during operation, for example, and the conversion material of the encapsulation material 202 produces yellow light, the component will be able to emit mixed light of a white color during operation.

On the light exit side 202a, the outer surface of the encapsulation material 202 which faces away from the connection carrier 201 can form the light exit surface 200 of the component.

In the example of FIG. 2C, the component further has a housing body 203 completely surrounding the radiation-emitting semiconductor chips in the lateral directions. Moreover, connecting elements 206a, 206b can be disposed between the housing body 203 and the radiation-emitting semiconductor chips 1, which connecting elements 206a, 206b are used to contact the p- and n-sides of the radiation-emitting semiconductor chips 1. The connecting elements 206a, 206b can also almost completely surround the semiconductor chips 1 in the lateral directions.

The housing body 203 and/or the connecting elements 206a, 206b may be of a design that will reflect the electromagnetic radiation produced by the semiconductor chips 1 during operation. Consequently, these elements serve to reflect and thus to mix the electromagnetic radiation of the component, i.e. the semiconductor chips of the first type are arranged in some kind of light mixing chamber. The housing body 203 may, for example, be formed with a reflecting material. For this purpose, the housing body 203 can be formed with a metal, a ceramic material and/or a plastic material.

The light exit surface 200 can, for example, be formed by the outer surface of a radiation-permeable top plate arranged downstream of the semiconductor chips 1 on the first side surfaces 16.

In the examples in FIGS. 2A, 2B, 2C, the radiation-emitting semiconductor chips of the first type 1 are completely arranged below the radiation exit surface 200. This means that the semiconductor chips 1 are not covered by the housing body or any other opaque element of the light-emitting component, for example. An emission of electromagnetic radiation from the radiation-emitting semiconductor chips can occur through all the exposed outer surfaces of the semiconductor chips. Due to reflecting properties of the connection carrier 200 and/or the housing body 203 and/or the connecting elements 206a, 206b, reflexion will occur in the direction of the radiation exit surface 200 for any electromagnetic radiation not emitted in this direction anyway. Electromagnetic radiation exiting the semiconductor chips 1 on a first side surface 16 thereof, may exit from the component directly through the light exit surface—after a conversion or scattering of light, if necessary—without being reflected by any other member of the component.

Figure 3A:
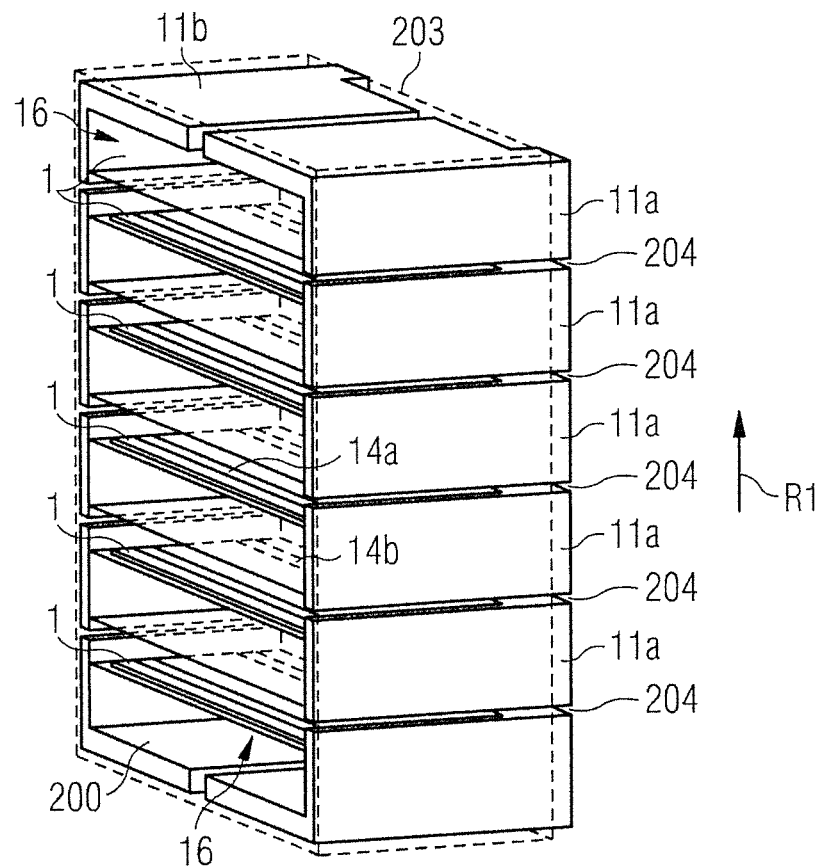
Figure 3B:
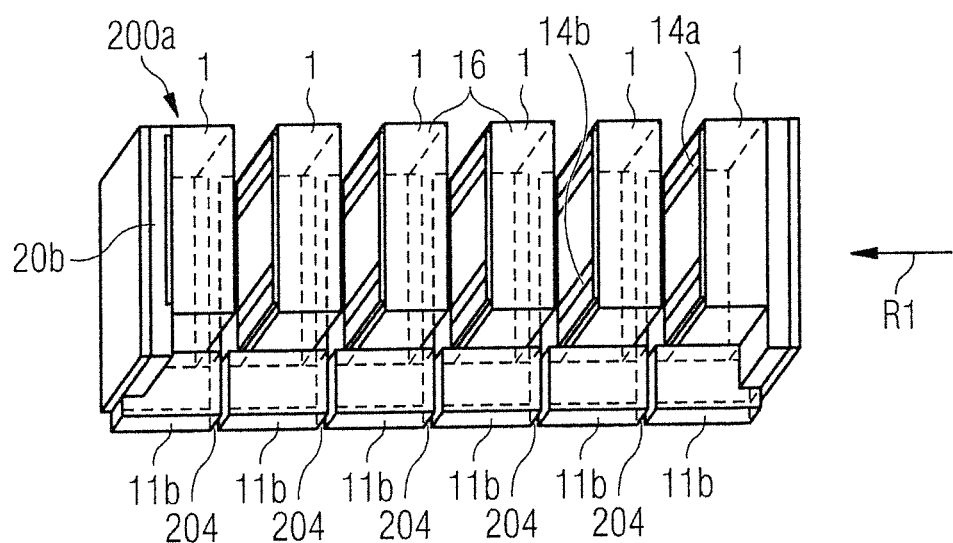

With reference to the schematic perspective views of FIGS. 3A and 3B, another example of a light-emitting component set forth herein will now be described in more detail. In contrast to the component illustrated in FIGS. 2A to 2C, this example does not have a connection carrier 201. In fact, some areas of the contact pads 11a, 11b protrude from the side facing away from the light exit surface 200 in the manner of pins and are freely accessible there. In this way, the contact pads 11a, 11b of the semiconductor chips can abut directly on a heat sink, thus allowing a particularly good heat dissipation of the component during operation. The contact pads 11a, 11b can be used to directly contact the radiation-emitting semiconductor chips 1, which radiation-emitting semiconductor chips can be configured to be controlled and operated individually. In the lateral directions, the radiation-emitting semiconductor chips may be surrounded by a housing body 203.

Between the contact pads 11a, 11b insulation means 204 may be provided which prevents like contact pads of directly adjoining radiation-emitting semiconductor chips from being connected to one another. This in particular allows the radiation-emitting semiconductor chips of the component to be contacted separately. For example, the insulation means 204 may be an electrically insulating material such as a ceramic material or a plastic material. Furthermore, it is possible to provide the insulation means 204 in the form of an air-filled gap.

Figure 4:
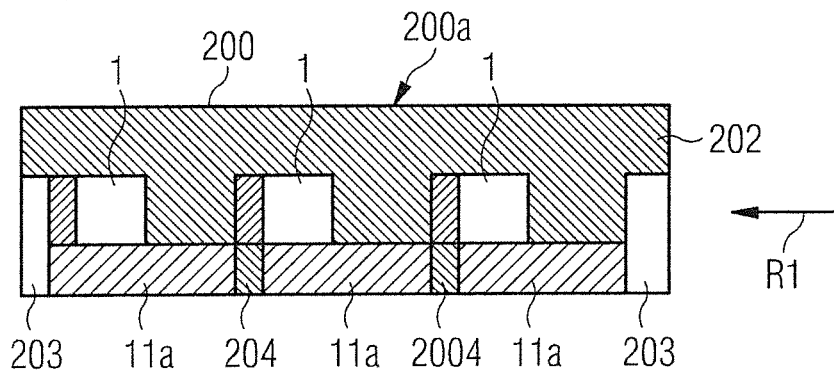

The schematic sectional view of FIG. 4 illustrates an example of a light-emitting component as set forth herein having an encapsulation material 202 applied on and between the semiconductor chips 1 in a component of the type described with reference to FIGS. 3A and 3B, for example. The encapsulation material 202 may extend above the housing body 203 in a vertical direction which is perpendicular to the light exit surface 200. Unlike the view of FIG. 4, it is also possible, however, to have the housing body 203 completely surround the encapsulation material 202 in a lateral direction and to have both the encapsulation material 202 and the housing body 203 extend above the semiconductor chips 1 in the vertical direction.

Figure 5A:
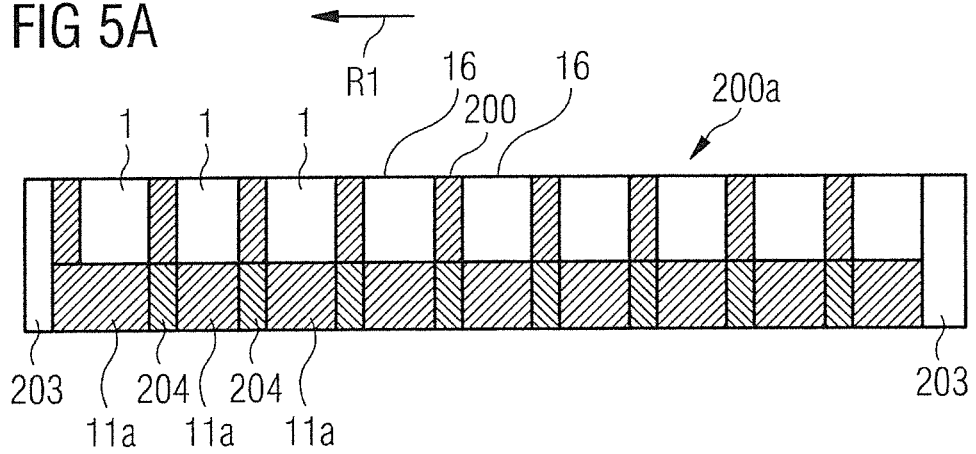
Figure 5B:
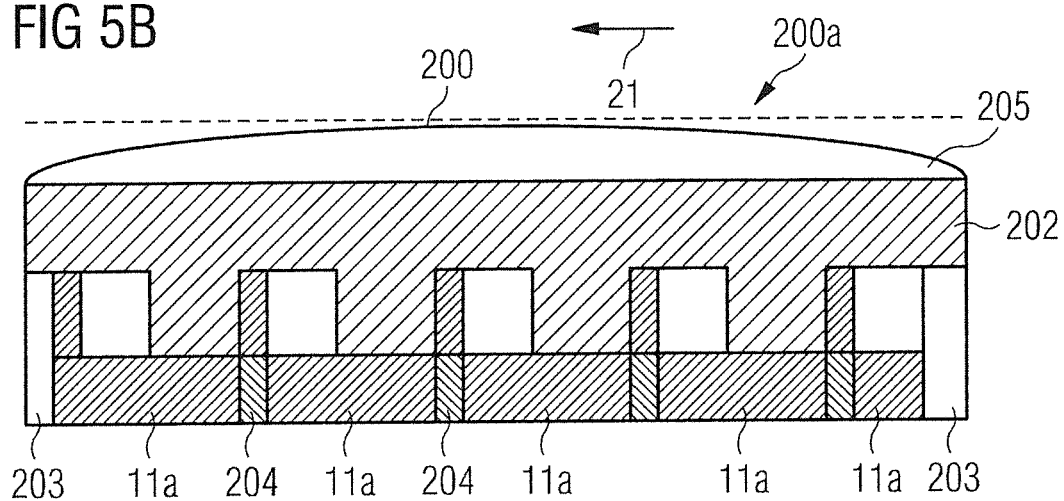

With reference to FIGS. 5A, 5B, which are schematic sectional views, further examples of light-emitting components set forth herein will now be described in more detail. In the example of FIG. 5A, the radiation-emitting semiconductor chips of the first type 1 are mounted so closely next to each other that they directly contact each other. In this way, the radiation-emitting semiconductor chips 1 can form a particularly homogeneous emission surface. In this case, the light exit surface 200 of the light-emitting component is constituted of the sum of the first side surfaces 16 of the semiconductor chips 1.

In the example of FIG. 5B, the radiation-emitting semiconductor chips 1 are arranged at a distance from one another. In the direction of the light exit surface 200, encapsulation material 202 is mounted above the radiation-emitting semiconductor chips of the first type 1 and between the radiation-emitting semiconductor chips of the first type 1, which encapsulation material 202 contains diffusely scattering and/or converting constituents. On the surface of the encapsulation material 202 facing the light exit surface 200 an optical element 205 may be mounted, for example, a convex lens, i.e. a lens that is arched outwardly.

With reference to the schematic perspective views of FIGS. 6A to 6E, further examples of light-emitting components as set forth herein will now be described in more detail. In these examples, the light-emitting component comprises, in addition to the radiation-emitting semiconductor chips of the first type 1, a radiation-emitting semiconductor chip of the second type 2. The radiation-emitting semiconductor chip of the second type 2 is arranged on the second side surface 15 of the semiconductor chips 1 such that any electromagnetic radiation emitted by the radiation-emitting semiconductor chip of the second type during operation will pass through the semiconductor chips of the first type 1. The radiation-emitting semiconductor chip 2, for example, generates electromagnetic radiation in a wavelength range longer than the wavelength range in which the semiconductor chips of the first type 1 emit electromagnetic radiation. This prevents the electromagnetic radiation of the semiconductor chip of the second type 2 from being absorbed in the semiconductor chips of the first type 1. It is possible to contact and operate the semiconductor chips of the first type 1 and the semiconductor chip of the second type 2 separately from each other.

The radiation-emitting semiconductor chip of the second type 2 comprises a semiconductor layer sequence 20 having a stacking direction R2. In the examples of FIGS. 6A to 6E, the stacking direction R2 is perpendicular to the light exit surface 200 and thus perpendicular to the stacking direction R1 of the semiconductor chips of the first type 1.

To contact the radiation-emitting semiconductor chips of the first type 1, connecting elements 206a, 206b may be provided which are formed with a metal, for example. As can be seen from the view of FIG. 6B, for example, the connecting elements 206a, 206b can include a step-like raised portion on which the contact pads 11a, 11b of the semiconductor chips of the first type 1 abut and to which they are electrically connected. The connecting elements 206a, 206b can then be contacted on the bottom surface of the component which bottom surface faces away from the light exit side 200.

Likewise provided on the bottom surface of the component are connecting points 207a, 207b that can be used to electrically contact the semiconductor chip of the second type 2.

In the lateral directions, the components described may be surrounded by the housing body 203.

Figure 6B:
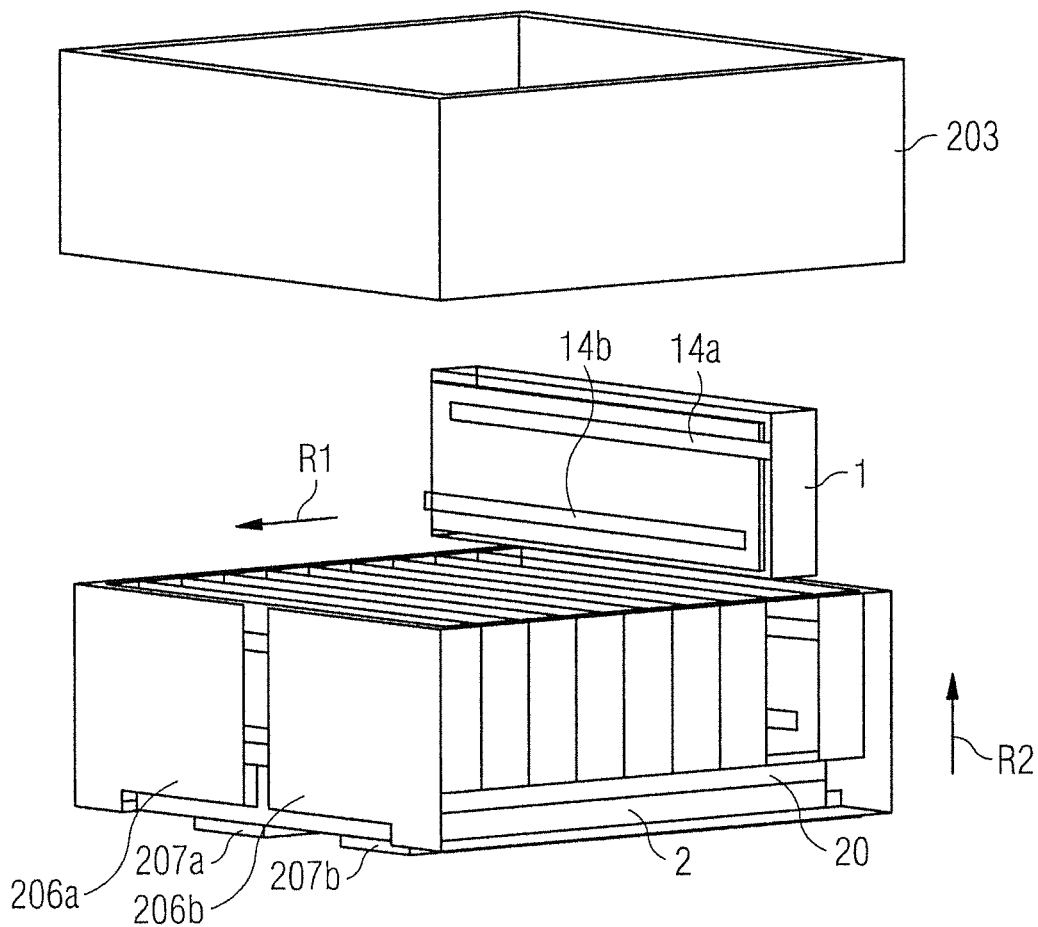
Figure 6C:
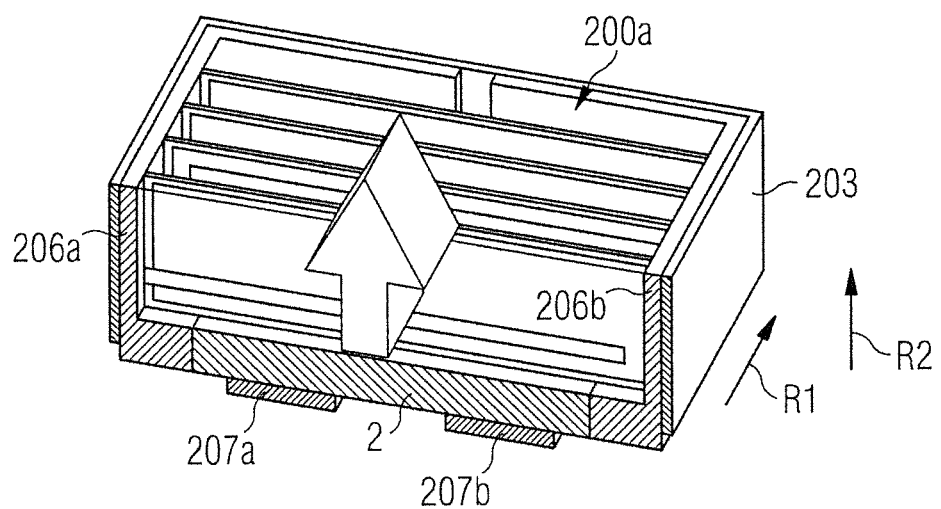
Figure 6D:
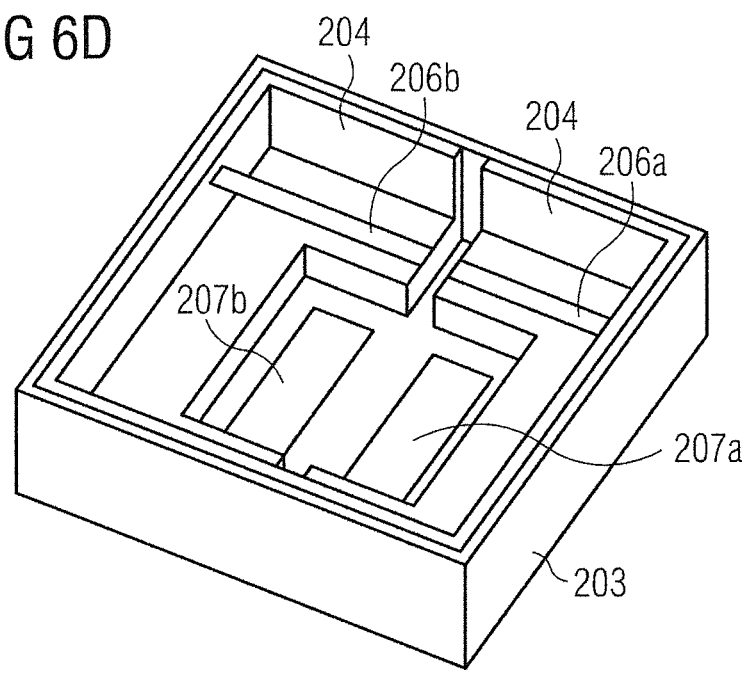
Figure 6E:
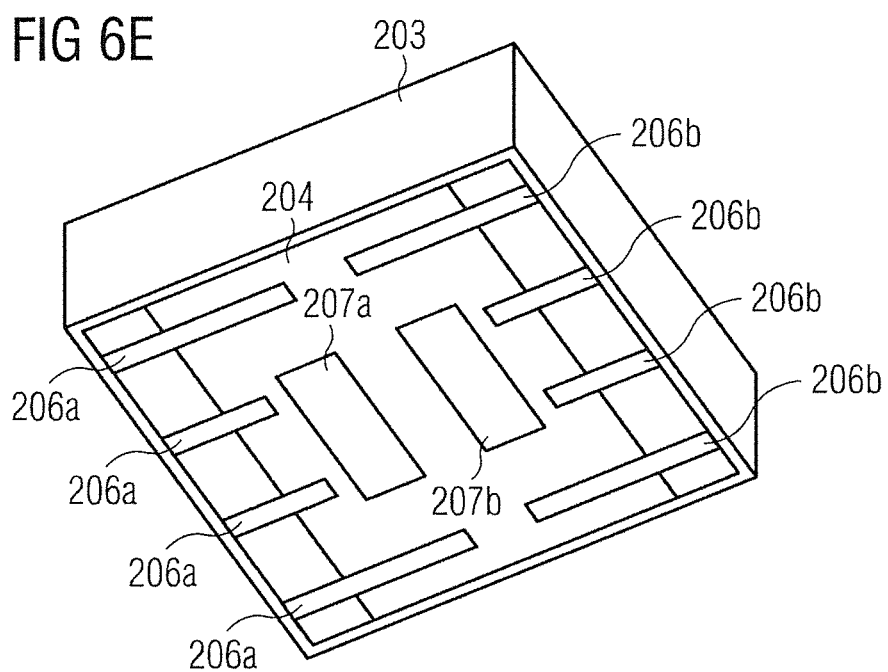

FIGS. 6D and 6E are views of an alternative example to contact the semiconductor chips of the first type 1. In this case, the component, for example, comprises an insulation means 204 that may take the form of a ceramic housing part. Incorporated in and/or mounted on parts of the insulation means 204 are the connecting elements 206a, 206b that contact the semiconductor chips of the first type 1. As shown in FIG. 6E, the connecting elements 206a, 206b as well as the connecting pads 207a, 207b can be contacted on the bottom side of the component. In total, the light-emitting component set forth herein can thus be a surface-mountable device.

Figure 7A:
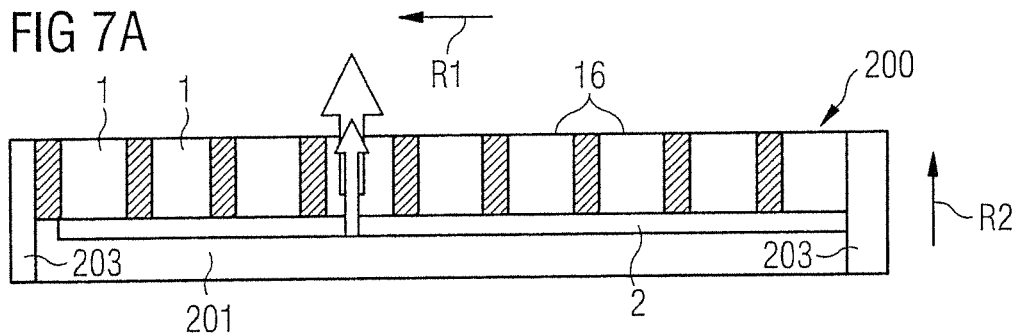
Figure 7B:
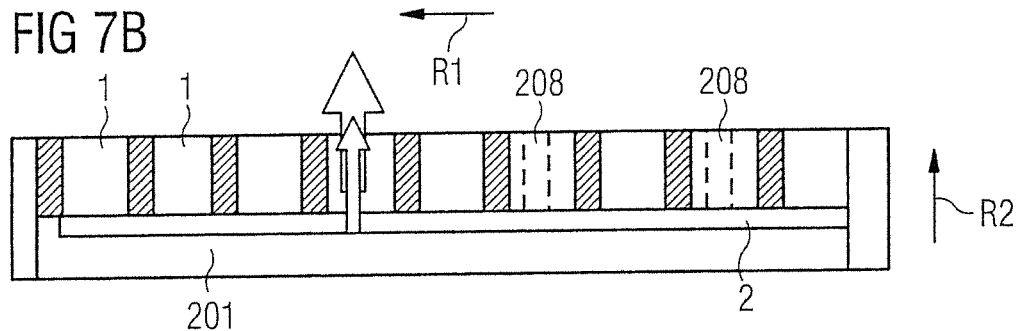

With reference to FIGS. 7A and 7B, various alternative examples of a light-emitting semiconductor device set forth herein having a semiconductor chip of the second type 2 and a plurality of semiconductor chips of the first type 1 will be described. The semiconductor chips 1, 2 can be contacted by a connection carrier 201, for example. In the example of FIG. 7A, the semiconductor chips of the first type 1 directly adjoin each other in the lateral directions such that the light exit surface is constituted of the sum of the first side surfaces 16 of the semiconductor chips of the first type 1. On the side of the semiconductor chips of the first type 1 facing away from the light exit surface 200, the semiconductor chip of the second type 2 is disposed which transilluminates the semiconductor chips of the first type 1.

For example, the semiconductor chips of the first type 1 may be semiconductor chips that emit blue light during operation which blue light is then converted into mixed light of a white color. The semiconductor chip of the second type 2 generates light of a longer wavelength which will not at all or hardly be absorbed in the semiconductor chips of the first type 1. For example, the semiconductor chip of the second type 2 generates red light during operation. For example, the component comprises precisely one semiconductor chip of the second type 2.

By contrast, in the example described with reference to FIG. 7B, reflector elements 208 for optical separation are inserted between adjacent semiconductor chips of the first type. These elements may, for example, be an encapsulation material having radiation scattering and/or radiation reflecting particles such as titanium dioxide particles incorporated in it such that the reflector elements 208 appear to be white, for example. This will allow the semiconductor chips of the first type 1 to also be operated optically separately from one another. The use of the reflector elements 208 in particular allows the individual semiconductor chips of the first type 1 to be operated separately from one another without any extraneous lighting. This is particularly advantageous when the semiconductor chips of the first type 1 emit light of different colors and are provided for the purpose of being operated separately from one another during operation.

Figure 8A:
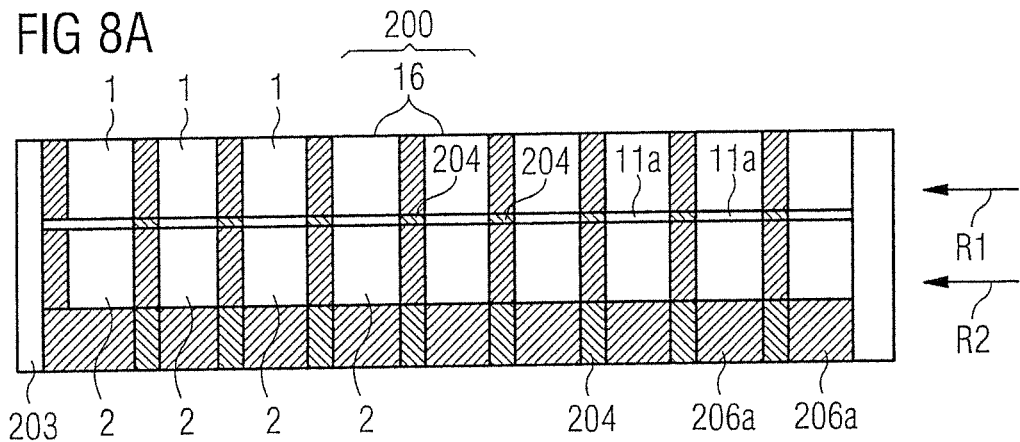
Figure 8B:
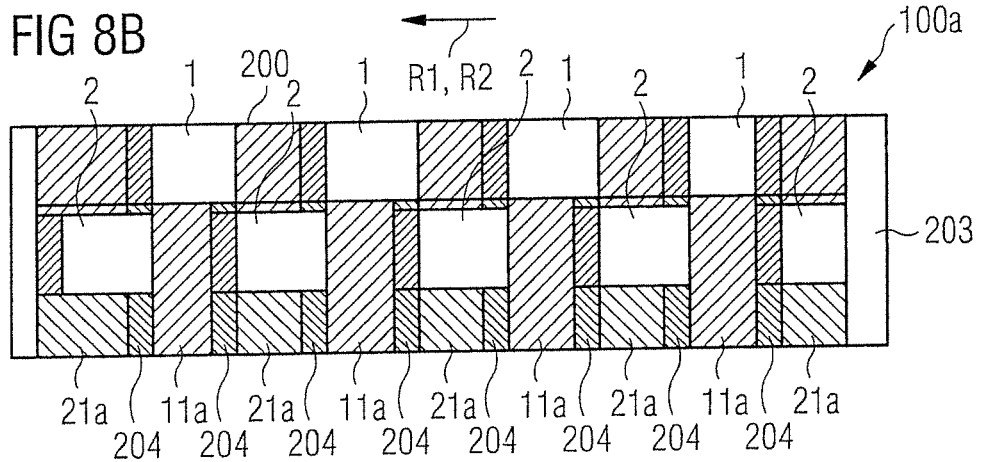

With reference to FIGS. 8A and 8B, examples of a light-emitting component set forth herein will be explained in which the optoelectronic semiconductor chips of the second type have a stacking direction R2 which is parallel to the light exit surface 200. In this case, the semiconductor chips 1, 2 can be operated separately from one another. In the example of FIG. 8A, each semiconductor chip of the second type 2 is in particular completely covered by a semiconductor chip of the first type. The first side surfaces 16 of the semiconductor chips of the first type 1 together form the light exit surface 200 of the component.

The stacking directions of the semiconductor chips of the first type R1 and of the second type R2 can be arranged in parallel or antiparallel relative to each other. FIG. 8A is a view of a light-emitting component which has a particularly large number of semiconductor chips arranged in a small area. The semiconductor chips of the first type and the semiconductor chips of the second type may emit different kinds of electromagnetic radiation, in particular light of different colors. Furthermore, it is possible for such a component to have three or more of the layers shown. In particular it is then possible to mount semiconductor chips above one another that emit red light, green light and blue light, thus resulting in white light to be produced when all the semiconductor chips are being operated at the same time.

In the example of FIG. 8B, the semiconductor chips of the second type are not covered by a semiconductor chip of the first type, meaning that in a lateral direction, for example, parallel to the stacking directions R1, R2, the semiconductor chips of the first type and the semiconductor chips of the second type are spaced and arranged alternately from each other. This allows the light from the semiconductor chips of the second type to be coupled out without first having to pass through a semiconductor chip of the first type. The semiconductor chips of the first type and the semiconductor chips of the second type can be contacted directly via their contact points 11a, 11b, 21a, 21b on the side facing away from the light exit surface 200.

Figure 9A:
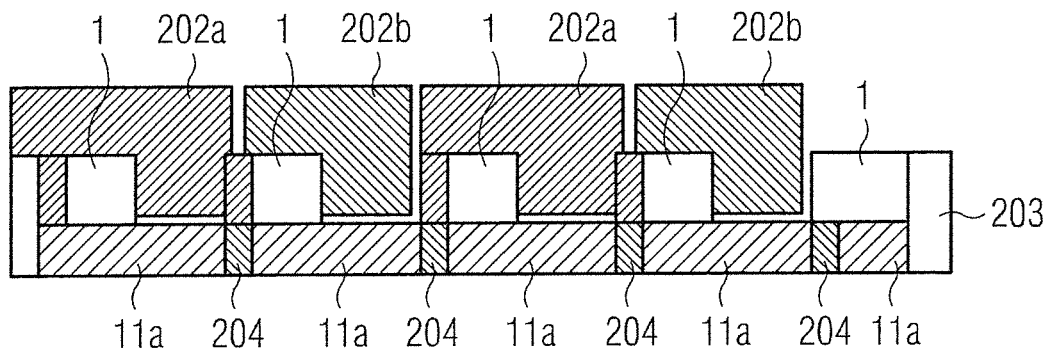
Figure 9B:
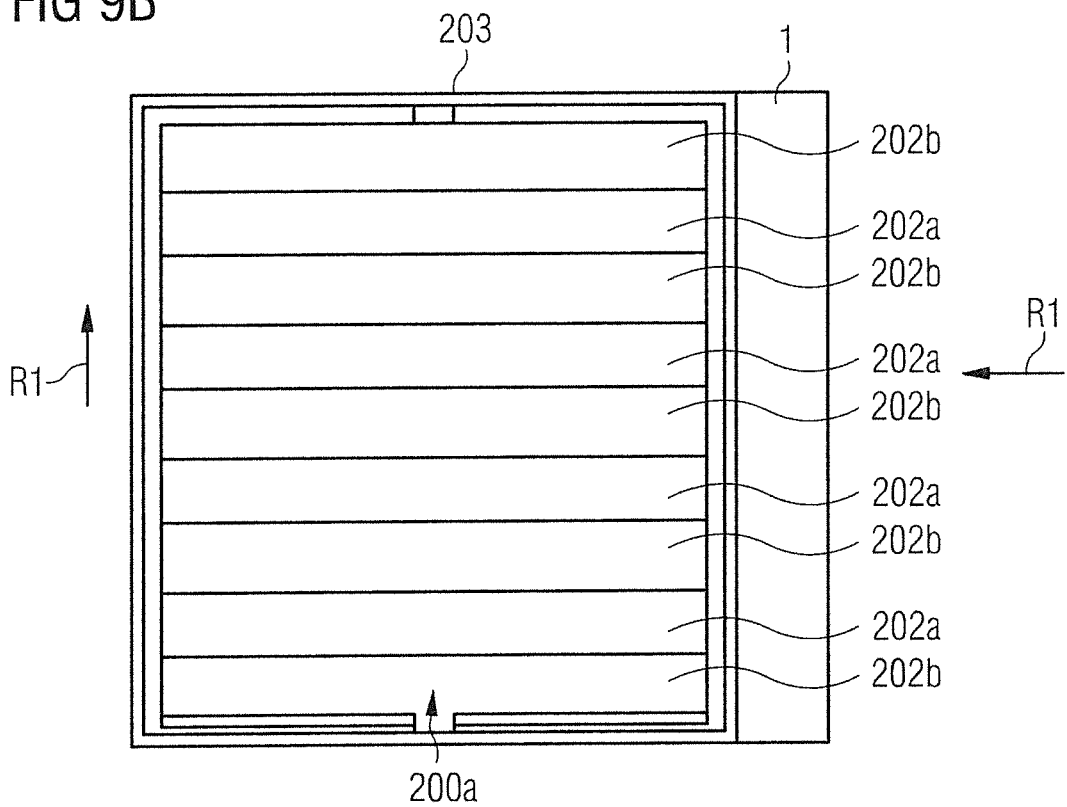

With reference to FIGS. 9A and 9B, an example will be described in which the light-emitting component comprises a semiconductor chip of the first type having a main extension direction perpendicular to the main extension directions of the other semiconductor chips of the first type. This means that the stacking directions R1, R2 are each parallel to the light exit surface 200, but perpendicular to one another.

For example, different encapsulation materials 200a, 200b may be alternately arranged downstream from the semiconductor chips of the first type in a first orientation thereof, which encapsulation materials may differ from each other regarding the conversion material used in the encapsulation materials, for example, thus resulting in warm and cold white light being emitted alternately.

The differently oriented semiconductor chip of the first type 1, shown on the right hand side in FIGS. 9A and 9B, may, for example, remain free of any encapsulation material and be adapted for the emission of infrared radiation, red light or light of a different color. In this way, the light-emitting component can constitute a flashlight, for example, capable of generating cold white light, warm white light and neutral white light. Furthermore, the flashlight may, for example, comprise a preflash of red light including the light from the non-encapsulated semiconductor chips of the first type 1.

It is also possible to provide different conversion materials on different optoelectronic semiconductor chips of the first type 1 in the other examples of the light-emitting component set forth herein.

Figure 10A:
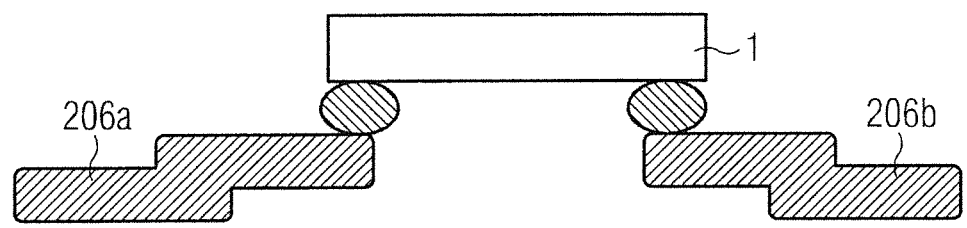
Figure 10B:
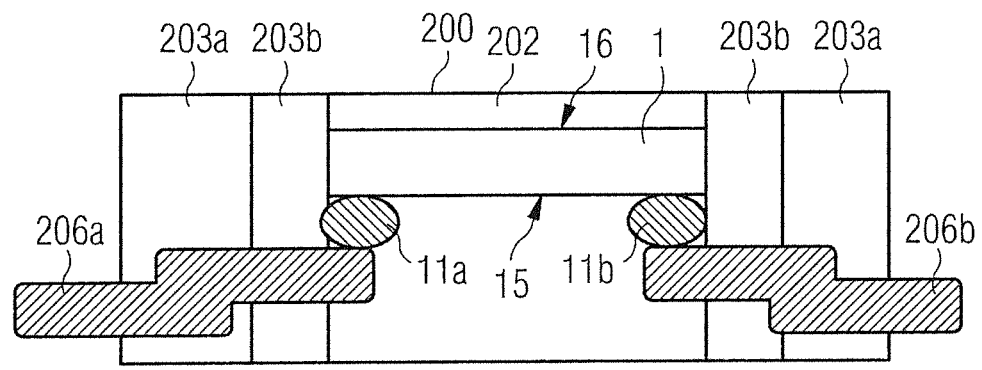

With reference to FIGS. 10A and 10B, production of a light-emitting component set forth herein will be described in which the semiconductor chips of the first type 1 are arranged on connecting elements 206a, 206b in the form of lead frames. After the semiconductor chips of the first type 1 have been applied, they can then be encapsulated in housing material 203. Such encapsulation may be performed by compression molding or transfer molding. The housing body 203 may have different portions 203a, 203b. Portion 203b may, for example, be formed by a reflecting part of the housing body formed with a plastic material filled with titanium dioxide, for example.

On the first side surface 16 of the semiconductor chips of the first type 1, an encapsulation material 202 may be arranged which comprises a conversion material, for example. In this case, it is also possible, as an alternative or in addition, to arrange the encapsulation material with the conversion material on the second side surface 15. This means that the conversion material is covered by the radiation-emitting semiconductor chips 1 of the first type and is not exposed on the outer surface of the semiconductor device.

Figure 11A:
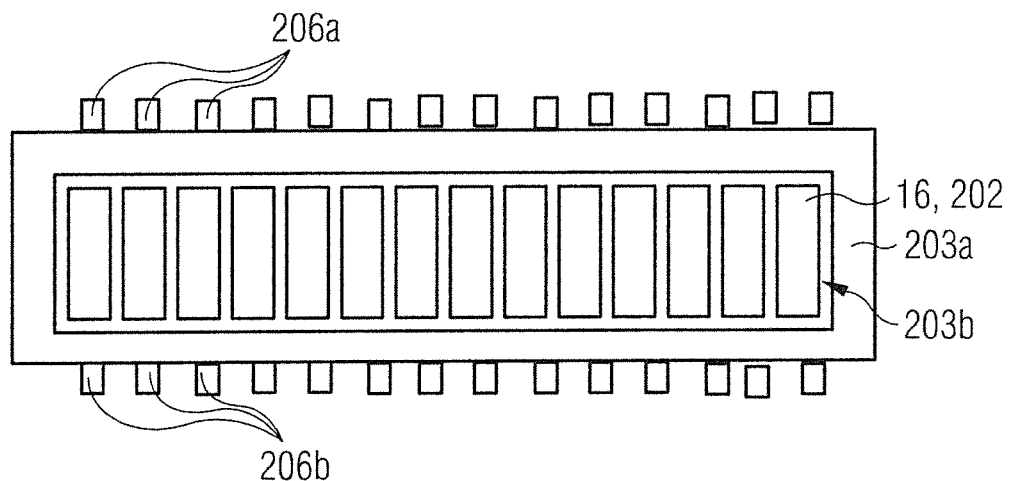
Figure 11B:
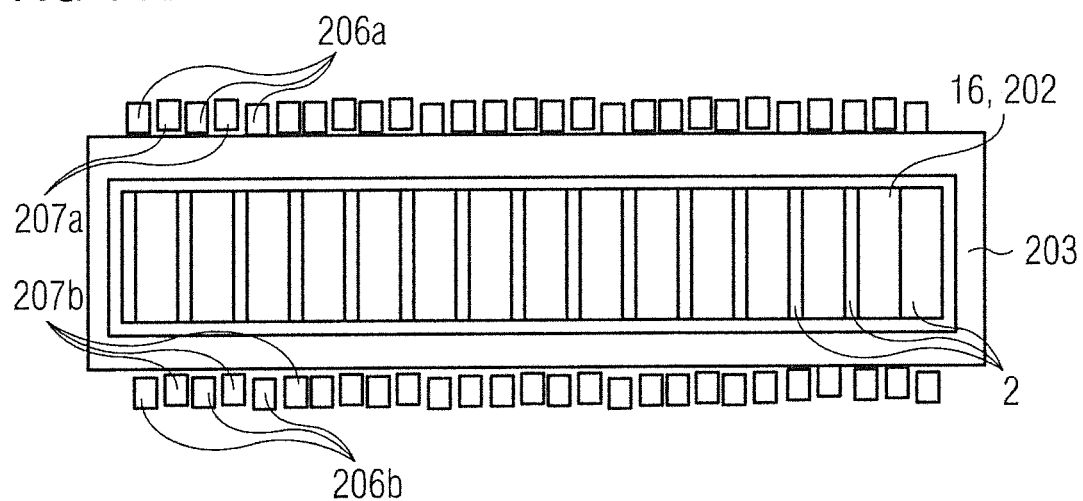

With reference to FIGS. 11A and 11B, schematic top views of the light-emitting components set forth herein will be described in more detail, which components were produced in accordance with the process described with reference to FIGS. 10A and 10B. In the example of FIG. 11A, the component exclusively comprises radiation-emitting semiconductor chips of the first type 1 surrounded by the housing body 203b in the lateral directions, which housing body 203b is a plastic material, for example, filled with titanium dioxide and appears to be white, for example.

In the example of FIG. 11B, one or plural semiconductor chips of the second type 2 are arranged below the semiconductor chips of the first type 1, with the remaining housing body 203b having been omitted.

In the examples of the light-emitting components set forth herein, it is also possible in particular to use semiconductor chips for the radiation-emitting semiconductor chips of the first type, for example, that will emit light of different colors during operation. In this way, the components set forth herein can be used to produce particularly compact RGB (Red-Green-Blue) light-emitting diodes.

Although my components have been described with reference to examples, their scope of protection shall not be restricted to these. This disclosure rather comprises any new feature as well as any combination of features, which in particular includes any combination of features in the appended claims, even if the feature or combination itself has not been explicitly specified in the claims or examples.

This application claims priority of DE 102016114277.8, the subject matter of which is incorporated herein by reference.

The invention claimed is:

1. A light-emitting component comprising:
   at least two radiation-emitting semiconductor chips of a first type configured to emit electromagnetic radiation during operation,
   a light exit surface at a light exit side of the light-emitting component, and
   at least one radiation-emitting semiconductor chip of a second type, wherein
   the radiation-emitting semiconductor chips of the first type are arranged between the at least one radiation-emitting semiconductor chip of the second type and the light exit surface,
   each radiation-emitting semiconductor chip of the second type is covered by a radiation emitting semiconductor chip of the first type on a side facing the light exit surface,
   each of the radiation-emitting semiconductor chips of the first and second types comprises a semiconductor layer sequence with a stacking direction,
   the stacking direction of each radiation-emitting semiconductor chip of the first and second types is parallel to the light exit surface of the component, and
   all the semiconductor chips of the first type are arranged directly below the light exit surface.

2. The light-emitting component according to claim 1, wherein the stacking directions of the semiconductor chips of the first type are parallel to each other.

3. The light-emitting component according to claim 1, wherein, in each radiation-emitting semiconductor chip of the first type, a first side surface is parallel to the light exit surface and a main extension plane of the semiconductor layer sequence is perpendicular to the light exit surface.

4. The light-emitting component according to claim 1, wherein contact pads of each radiation-emitting semiconductor chip of the first type are freely accessible on a side of the component facing away from the light exit side.

5. The light-emitting component according to claim 1, wherein the at least one radiation-emitting semiconductor chip of the second type has a semiconductor layer sequence with a stacking direction, said stacking direction is transverse or perpendicular relative to the light exit surface of the component, and the radiation-emitting semiconductor chip of the second type is partially covered by the radiation-emitting semiconductor chips of the first type on its side facing the light exit surface.

6. A light-emitting component comprising:

at least two radiation-emitting semiconductor chips of a first type configured to emit electromagnetic radiation during operation, at least one radiation-emitting semiconductor chip of a second type configured to emit electromagnetic radiation during operation, and a light exit surface at a light exit side of the light-emitting component, wherein each of the radiation-emitting semiconductor chips of the first type comprises a semiconductor layer sequence with a stacking direction, each of the radiation-emitting semiconductor chips of the second type comprises a second semiconductor layer sequence having a second stacking direction, the stacking direction of each radiation-emitting semiconductor chip of the first type is parallel to the light exit surface of the component, all the semiconductor chips of the first type are arranged directly below the light exit surface, the radiation-emitting semiconductor chips of the first type are arranged between the at least one radiation-emitting semiconductor chip of the second type and the light exit surface, and the second stacking direction is transverse or perpendicular to the light exit surface of the component, and the radiation-emitting semiconductor chip of the second type is partly covered by the radiation-emitting semiconductor chips of the first type on its side facing the light exit surface.

7. The light-emitting component according to claim 6, wherein the stacking directions of the semiconductor chips of the first type are parallel to each other.

8. The light-emitting component according to claim 6, wherein each radiation-emitting semiconductor chip of the first type has a first side surface thereof extending parallel to the light exit surface and a main extension plane of the semiconductor layer sequence extending perpendicular to the light exit surface.

9. The light-emitting component according to claim 6, wherein contact pads of each radiation-emitting semiconductor chip of the first type are freely accessible on a side of the component facing away from the light exit side.

* * * * *